(12) United States Patent
Mehr et al.

(10) Patent No.: US 10,741,507 B2
(45) Date of Patent: Aug. 11, 2020

(54) GROUNDING TECHNIQUES FOR BACKSIDE-BIASED SEMICONDUCTOR DICE AND RELATED DEVICES, SYSTEMS AND METHODS

(71) Applicant: Microchip Technology Incorporated, Chandler, AZ (US)

(72) Inventors: Behrooz Mehr, Chandler, AZ (US); Fernando Chen, Gilbert, AZ (US); Emmanuel de los Santos, Santa Clara, CA (US); Alex Kungo, Fremont, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 15/891,775

(22) Filed: Feb. 8, 2018

(65) Prior Publication Data

US 2018/0233463 A1   Aug. 16, 2018

Related U.S. Application Data

(60) Provisional application No. 62/457,490, filed on Feb. 10, 2017.

(51) Int. Cl.
*H01L 23/60* (2006.01)
*H01L 23/498* (2006.01)
(Continued)

(52) U.S. Cl.
CPC .......... *H01L 23/60* (2013.01); *H01L 21/4853* (2013.01); *H01L 23/3114* (2013.01);
(Continued)

(58) Field of Classification Search
None
See application file for complete search history.

(56) References Cited

U.S. PATENT DOCUMENTS 6,121,070 A * 9/2000 Akram ............... H01L 23/50
                                                438/108
6,297,550 B1 * 10/2001 Chia ............... H01L 23/053
                                                174/252
(Continued)

FOREIGN PATENT DOCUMENTS

JP  WO201414167871 A1 * 10/2014 ......... H01L 23/5223
WO  2004/080134 A2   9/2004
WO  2014/167871 A1   10/2014

OTHER PUBLICATIONS

Written Opinion of the International Searching Authority for PCT Application No. PCT/US2018/017469 dated May 29, 2018, ten pages.

(Continued)

*Primary Examiner* — Nilufa Rahim
(74) *Attorney, Agent, or Firm* — TraskBritt

(57) ABSTRACT

Semiconductor devices may include a substrate and a backside-biased semiconductor die supported above the substrate. A backside surface of the backside-biased semiconductor die may be spaced from the substrate. The backside surface may be electrically connected to ground by wire bonds extending to the substrate. Methods of making semiconductor devices may involve supporting a backside-biased semiconductor die supported above a substrate, a backside surface of the backside-biased semiconductor die being spaced from the substrate. The backside surface may be electrically connected to ground by wire bonds extending to the substrate. Systems may include a sensor device, a nontransitory memory device, and at least one semiconductor device operatively connected thereto. The at least one semiconductor device may include a substrate and a backside-biased semiconductor die supported above the substrate. A backside surface of the backside-biased semicon-
(Continued)

ductor die may be electrically connected to ground by wire bonds extending to the substrate.

5 Claims, 3 Drawing Sheets

(51) Int. Cl.
    *H01L 23/00*     (2006.01)
    *H01L 25/065*     (2006.01)
    *H01L 21/48*     (2006.01)
    *H01L 25/00*     (2006.01)
    *H01L 23/31*     (2006.01)
    *H01L 23/482*     (2006.01)
    *H01L 23/552*     (2006.01)

(52) U.S. Cl.
    CPC ........ *H01L 23/482* (2013.01); *H01L 23/4825* (2013.01); *H01L 23/49838* (2013.01); *H01L 23/552* (2013.01); *H01L 24/16* (2013.01); *H01L 24/32* (2013.01); *H01L 24/48* (2013.01); *H01L 24/73* (2013.01); *H01L 25/0657* (2013.01); *H01L 25/50* (2013.01); *H01L 23/3121* (2013.01); *H01L 2224/0401* (2013.01); *H01L 2224/04042* (2013.01); *H01L 2224/05624* (2013.01); *H01L 2224/05644* (2013.01); *H01L 2224/05647* (2013.01); *H01L 2224/16225* (2013.01); *H01L 2224/16227* (2013.01); *H01L 2224/2919* (2013.01); *H01L 2224/2929* (2013.01); *H01L 2224/32145* (2013.01); *H01L 2224/32225* (2013.01); *H01L 2224/32245* (2013.01); *H01L 2224/48091* (2013.01); *H01L 2224/48225* (2013.01); *H01L 2224/48227* (2013.01); *H01L 2224/4918* (2013.01); *H01L 2224/49112* (2013.01); *H01L 2224/73215* (2013.01); *H01L 2224/73253* (2013.01); *H01L 2224/73257* (2013.01); *H01L 2224/73265* (2013.01); *H01L 2224/83851* (2013.01); *H01L 2225/0651* (2013.01); *H01L 2225/06517* (2013.01); *H01L 2225/06524* (2013.01); *H01L 2225/06537* (2013.01); *H01L 2225/06548* (2013.01); *H01L 2225/06558* (2013.01); *H01L 2225/06572* (2013.01); *H01L 2225/06582* (2013.01); *H01L 2924/00014* (2013.01); *H01L 2924/1434* (2013.01); *H01L 2924/19107* (2013.01); *H01L 2924/3025* (2013.01)

(56) References Cited

U.S. PATENT DOCUMENTS

| | | | |
|---|---|---|---|
| 6,353,263 | B1 | 3/2002 | Dotta et al. |
| 7,732,929 | B2 * | 6/2010 | Otremba ............. H01L 23/3107 257/177 |
| 7,928,555 | B2 | 4/2011 | Kim et al. |
| 2004/0238857 | A1 * | 12/2004 | Beroz ................ H01F 17/0033 257/232 |
| 2007/0045829 | A1 | 3/2007 | Jeong et al. |
| 2007/0228468 | A1 * | 10/2007 | Wakabayashi ........ H01L 21/563 257/347 |
| 2008/0029869 | A1 | 2/2008 | Kwon et al. |
| 2010/0013066 | A1 * | 1/2010 | Kim ..................... H01L 23/552 257/660 |
| 2013/0249109 | A1 * | 9/2013 | Ma ..................... B81C 1/00301 257/774 |
| 2015/0373876 | A1 * | 12/2015 | Berke ................... G05B 15/02 700/282 |

OTHER PUBLICATIONS

International Search Report for PCT Application No. PCT/US2018/017469 dated May 29, 2018, five pages.

* cited by examiner

GROUNDING TECHNIQUES FOR BACKSIDE-BIASED SEMICONDUCTOR DICE AND RELATED DEVICES, SYSTEMS AND METHODS

CROSS-REFERENCE TO RELATED APPLICATION

This application claims the benefit under 35 U.S.C. § 119(e) of U.S. Provisional Patent Application Ser. No. 62/457,490, filed Feb. 10, 2017, the disclosure of which is incorporated herein in its entirety by this reference.

FIELD

This disclosure relates generally to semiconductor devices and methods of making semiconductor devices. More specifically, disclosed embodiments relate to techniques for grounding backside-biased semiconductor dice, methods that may enable flip-chip orientation and stacking of backside-biased semiconductor dice, resulting semiconductor devices and systems incorporating such semiconductor devices.

BACKGROUND

Semiconductor devices may be "backside biased," meaning that the devices may include a region of dielectric material located between an active surface of the semiconductor devices and backside surfaces of the semiconductor devices. As electrical currents are processed by integrated circuitry embedded within or located on the active surface, the dielectric material may cause the semiconductor device to operate as a capacitor, with charge accumulating in the semiconductor material of the semiconductor device at the backside surface. The accumulated charge may undesirably interact with the integrated circuitry, causing the semiconductor device to behave in unintended ways or even damaging the semiconductor device.

BRIEF DESCRIPTION OF THE DRAWINGS

While this disclosure concludes with claims particularly pointing out and distinctly claiming specific embodiments, various features and advantages of embodiments within the scope of this disclosure may be more readily ascertained from the following description when read in conjunction with the accompanying drawings, in which:

DETAILED DESCRIPTION

The illustrations presented in this disclosure are not meant to be actual views of any particular semiconductor device, system including a semiconductor device, or component thereof, but are merely idealized representations employed to describe illustrative embodiments. Thus, the drawings are not necessarily to scale.

Disclosed embodiments relate generally to techniques for grounding backside-biased semiconductor dice and related methods that may enable flip-chip orientation and stacking of backside-biased semiconductor dice. More specifically, disclosed are embodiments of semiconductor devices that may include backside-biased semiconductor dice in a flip-chip configuration including wire bonds extending from proximate a backside of the semiconductor die to electrical ground. As another specific example, embodiments of semiconductor devices that may include a grounding interposer electrically connected to a backside surface of a backside-biased semiconductor die are disclosed, in which the grounding interposer may include wire bonds extending from the grounding interposer to electrical ground.

As used herein, the terms "substantially" and "about" in reference to a given parameter, property, or condition means and includes to a degree that one of ordinary skill in the art would understand that the given parameter, property, or condition is met with a degree of variance, such as within acceptable manufacturing tolerances. For example, a parameter that is substantially or about a specified value may be at least about 90% the specified value, at least about 95% the specified value, at least about 99% the specified value, or even at least about 99.9% the specified value.

Figure 1:
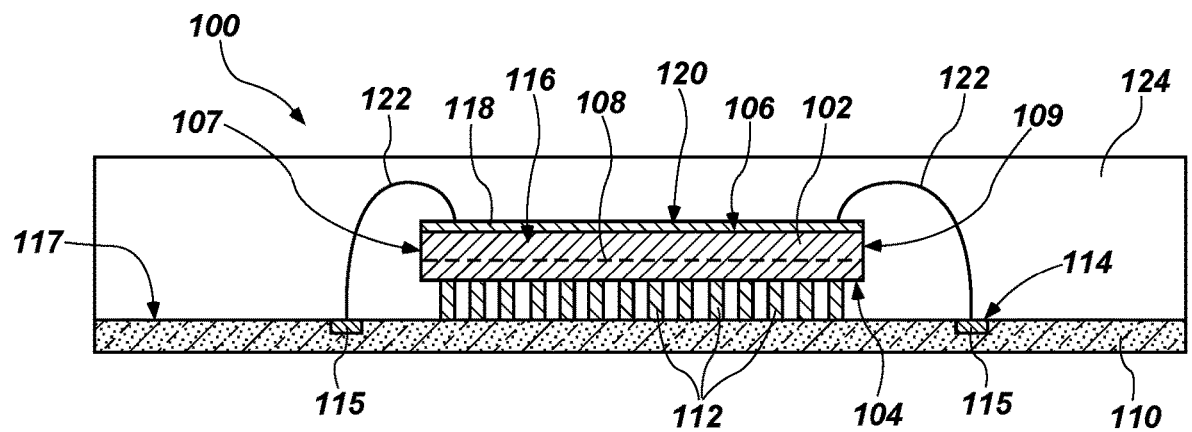
FIG. 1 is a cross-sectional side view of a semiconductor device including a backside-biased semiconductor die in a flip-chip configuration.

Referring to FIG. 1, a cross-sectional side view of a semiconductor device 100 including a backside-biased semiconductor die 102 in a flip-chip configuration is shown. The backside-biased semiconductor die 102 may include an active surface 104 and a backside surface 106 located on a side of the semiconductor die 102 opposite the active surface 104. The active surface 104 may include integrated circuitry embedded within and/or located on semiconductor material of the semiconductor die 102 at the active surface 104. The backside surface 106 may lack such integrated circuitry. The semiconductor die 102 may include an insulating material 108 located within the semiconductor die 102 between the active surface 104 and the backside surface 106. The insulating material 108 may extend laterally between side surfaces 107 and 109 on opposite lateral sides of the semiconductor die 102, such that the insulating material 108 may form an electrical barrier longitudinally between the active surface 104 and the backside surface 106. The insulating material 108 may be, for example, in the form of a layer and may include, for example, an oxidized region of the semiconductor material of the semiconductor die 102 (e.g., silicon oxide when the semiconductor die 102 includes a silicon material). As a specific, nonlimiting example, the semiconductor die 102 may be a silicon-on-insulator (SOI) device comprising a layer of silicon carried by an electrically insulating substrate, for example, a glass substrate. The semiconductor die 102 may be backside-biased to reduce the likelihood that interaction between the operation of the integrated circuitry embedded within the active surface 104 and the insulating material 108 may cause unwanted charge to form in a region 116 of the semiconductor die 102 between the insulating material 108 and the backside surface 106 which may, without such backside biasing, result in unintended interactions or damage.

The semiconductor die 102 may be operatively connected to, and be supported on a substrate 110. The active surface 104 of the semiconductor die 102 may face the substrate 110, such that the semiconductor die 102 is flip-chip attached to the substrate 110. The backside surface 106 of the semiconductor die 102 may be spaced from the substrate 110 by a distance greater than or equal to a thickness of the semiconductor die 102 as measured from the active surface 104 to the backside surface 106. Electrically conductive elements 112 in the form of, for example, bumps, balls, pillars or studs, may electrically and mechanically connect the active surface 104 of the semiconductor die 102 to the substrate 110.

The backside surface 106 may beneficially be electrically connected to ground 114 or other reference or bias voltage (e.g., to a reference voltage from which other voltages in the semiconductor device 100 may be measured, to a return path for electrical current, or to a sink for electrical energy). The term "ground" as used herein means and includes conventional ground as well as other applied reference or bias voltage. Connection of the backside surface 106 to ground 114 may enable unwanted charge that would otherwise form in the region 116 of the semiconductor die 102 between the insulating material 108 and the backside surface 106 to dissipate, reducing the likelihood that such unwanted charge could cause unintended interactions or damage.

To electrically connect the backside surface 106 to ground 114, an electrically conductive material 118 may be placed in electrical contact with the backside surface 106. As shown in FIG. 1, the electrically conductive material 118 may take the form of a mass 120 of the electrically conductive material 118 located directly on the backside surface 106 on a side of the semiconductor die 102 opposite the active surface 104. More specifically, the electrically conductive material 118 may cover, for example, at least a portion of the backside surface 106 up to, and including, an entirety of the backside surface 106. As specific, nonlimiting examples, the electrically conductive material 118 may cover between about 10% and about 100%, between about 50% and about 100%, or between about 75% and about 100% of the backside surface 106. The electrically conductive material 118 may be a single, contiguous mass 120, as shown in FIG. 1, or may be divided into several discrete masses of the electrically conductive material 118 on the backside surface 106. In other embodiments, the electrically conductive material 118 may take the form of, for example, various implementations of a grounding interposer, as shown and described in greater detail in connection with FIGS. 2 through 4. The mass 120 of electrically conductive material 118 may be positioned on the backside surface 106 by, for example, a plating (e.g., electroplating, electroless plating, chemical plating, etc.), a chemical vapor deposition (CVD) process, by application as a preformed film, or by a sputtering (i.e., physical vapor deposition) process. The mass 120 of electrically conductive material 118 may include, for example, an electrically conductive metal or metal alloy. As specific, nonlimiting examples, the mass 120 may include copper, gold, aluminum, or alloys including such metals.

One or more wire bonds 122 may extend from the electrically conductive material 118 to the substrate 110 to electrically connect the backside surface 106 to ground 114. More specifically, each wire bond 122 may extend, for example, from the mass 120 of (or a corresponding discrete mass of) the electrically conductive material 118 to an electrically conductive element 115 located on an upper surface 117 of the substrate 110 facing the semiconductor die 102. As specific, nonlimiting examples, the wire bonds 122 may extend from the electrically conductive material 118 to electrically conductive elements 115 in the form of bond pads, traces, vias, or other electrically conductive structures on the upper surface 117 of the substrate 110. The semiconductor die 102, mass 120 of electrically conductive material 118, wire bonds 122, electrically conductive elements 112, electrically conductive elements 115 at ground 114, and upper surface 117 of the substrate 110 may be embedded within a dielectric encapsulant material 124.

Figure 2:
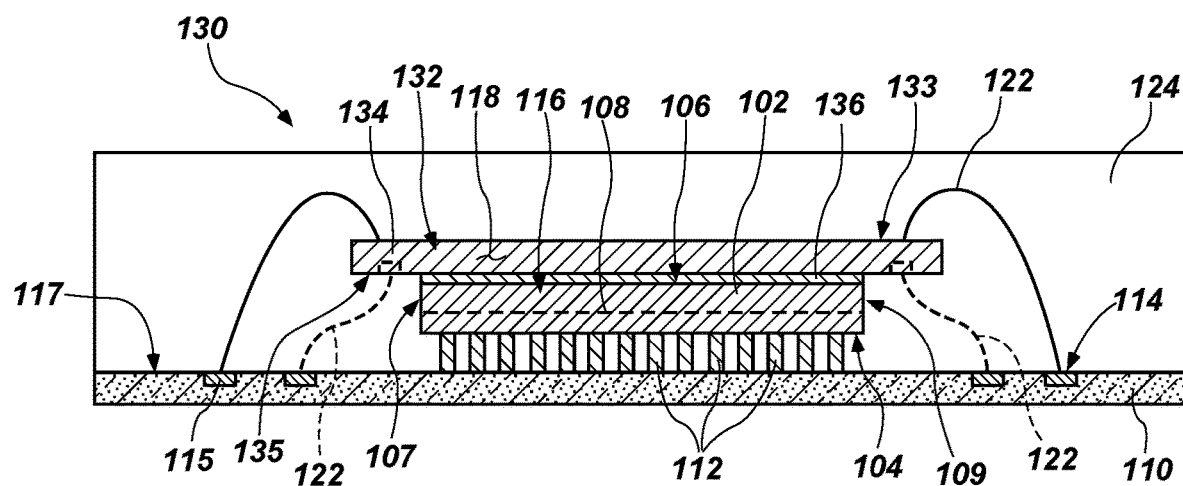
FIG. 2 is a cross-sectional side view of another embodiment of a semiconductor device including a backside-biased semiconductor die in a flip-chip configuration.

FIG. 2 is a cross-sectional side view of another embodiment of a semiconductor device 130 including a backside-biased semiconductor die 102 in a flip-chip configuration. In some embodiments, such as that shown in FIG. 2, a grounding interposer 132 may be electrically connected to the backside surface 106 of the semiconductor die 102, in lieu of directly positioning a mass 120 (see FIG. 1) of electrically conductive material 118 on the backside surface 106. The grounding interposer 132 may include, for example, a plate 134 of electrically conductive material 118, as shown in FIG. 2, a printed circuit board, a semiconductor chip, a redistribution layer, a lead frame, or any other suitable device or structure that may be electrically connected to the backside surface 106 of the semiconductor die 102 to electrically connect the backside surface 106 to ground 114. The grounding interposer 132 may extend laterally beyond the lateral side surfaces 107 and 109 of the semiconductor die 102, as shown in FIG. 2, as well as beyond other lateral side surfaces (not shown) perpendicular thereto. In other embodiments, the grounding interposer 132 may extend to be laterally flush with the lateral side surfaces 107 and 109 of the semiconductor die 102, or the lateral side surfaces 107 and 109 of the semiconductor die 102 may extend laterally beyond the grounding interposer 132.

The grounding interposer 132 may be mechanically and electrically connected to the backside surface 106 of the semiconductor die 102 by, for example, an electrically conductive adhesive material 136. The electrically conductive adhesive material 136 may be positioned in direct contact with, and be interposed between, the backside surface 106 of the semiconductor die 102 and the grounding interposer 132. The electrically conductive adhesive material 136 may include, for example, a conductive epoxy, a conductor-filled epoxy, a conductive paste, a conductive underfill, a conductive encapsulant, or other adhesive material. As a specific, nonlimiting example, the electrically conductive adhesive material 136 may include bismaleimide-triazine epoxy.

The wire bonds 122 may extend from an upper surface 133 located on a side of the grounding interposer 132 opposite the semiconductor die 102. In embodiments where the wire bonds 122 are configured as flexible electrical connections (e.g., ribbons of electrically conductive material), the wire bonds 122 may extend from a lower surface 135 located on a side of the grounding interposer 132 facing the semiconductor die 102, or both the upper surface 133 and the lower surface 135 of the grounding interposer 132 to the ground 114 at the substrate 110. The wire bonds 122 may extend from positions on the grounding interposer 132 located laterally beyond the lateral side surfaces 107 and 109, as shown in FIG. 2, or located between the lateral confines of the lateral side surfaces 107 and 109, particularly in embodiments where the wire bonds extend from the upper surface 133 of the grounding interposer 132.

Figure 3:
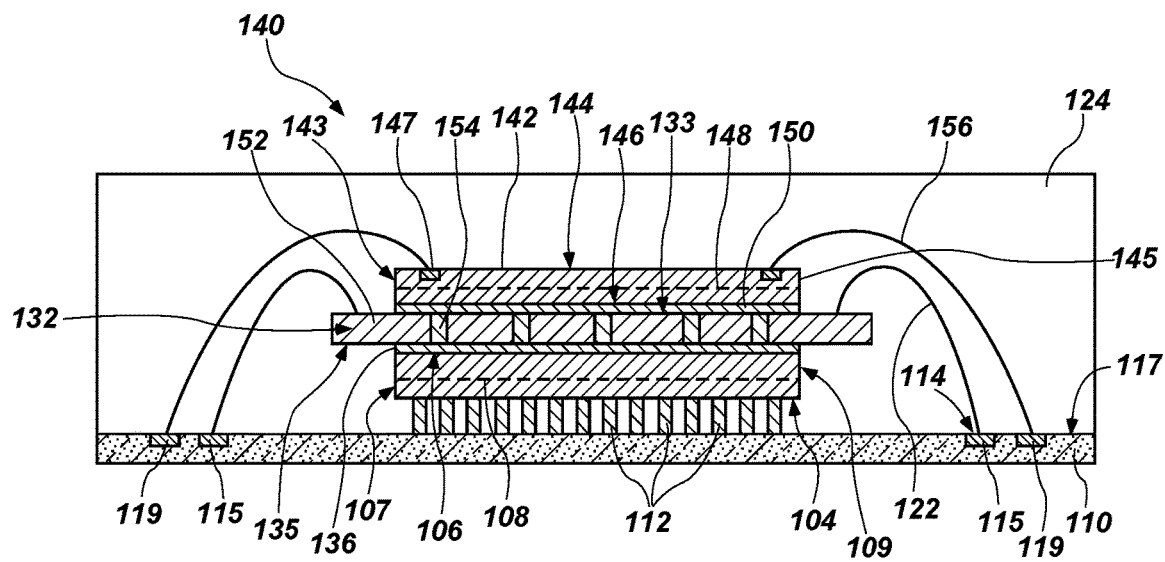
FIG. 3 is a cross-sectional side view of a semiconductor device including a stacked, backside-biased semiconductor die.

FIG. 3 is a cross-sectional side view of a semiconductor device 140 including both a biased first semiconductor die 102 and a stacked, backside-biased second semiconductor die 142. The semiconductor device 140 may include the first semiconductor die 102 configured in at least substantially the same manner as shown and described in connection with FIG. 2. A second semiconductor die 142 may be located on a side of the grounding interposer 132 opposite the first semiconductor die 102. The second semiconductor die 142 may likewise be backside-biased, and may include an active surface 144, a backside surface 146 on a side of the second semiconductor die 142 opposite the active surface 144, and an electrically insulating material 148 located within the material of the second semiconductor die 142 between the active surface 144 and the backside surface 146. The active surface 144 may include integrated circuitry embedded within or located on semiconductor material of the second semiconductor die 142 at the active surface 144. The backside surface 146 may lack such integrated circuitry. The electrically insulating material 148 may extend laterally between side surfaces 143 and 145 on opposite lateral sides of the second semiconductor die 142, such that the insulating material 148 may form an electrical barrier longitudinally between the active surface 144 and the backside surface 146. The electrically insulating material 148 may be, for example, in the form of a layer and may include, for example, an oxidized region of the semiconductor material of the second semiconductor die 142 (e.g., silicon oxide when the second semiconductor die 142 includes a silicon material). As a specific, nonlimiting example, the second semiconductor die 142 may be a silicon-on-insulator (SOI) device.

The backside surface 146 of the second semiconductor die 142 may be mechanically and electrically connected to the grounding interposer 132 by a second electrically conductive adhesive material 150. For example, the backside surface 106 of the first semiconductor die 102 may be mechanically and electrically connected to a lower surface 135 on a side of the grounding interposer 132 opposite the second semiconductor die 142 and the backside surface 146 of the second semiconductor die 142 may be mechanically and electrically connected to an upper surface 133 on a side of the grounding interposer 132 opposite the first semiconductor die 102 by the second electrically conductive adhesive material 150, such that the grounding interposer 132 is interposed between the first semiconductor die 102 and the second semiconductor die 142. In this arrangement, the backside surface 106 of the first semiconductor die 102 may face toward the backside surface 146 of the second semiconductor die 142, and the active surface 104 of the first semiconductor die 102 may face away from the active surface 144 of the second semiconductor die 142. More specifically, the active surface 104 of the first semiconductor die 102 may face toward the substrate 110, the backside surface 106 of the first semiconductor die 102 may face toward the grounding interposer 132, the backside surface 146 of the second semiconductor die 142 may face toward the grounding interposer 132, the first semiconductor die 102, and the substrate 110, and the active surface 144 of the second semiconductor die 142 may be located on a side of the second semiconductor die 142 opposite the grounding interposer 132, the first semiconductor die 102, and the substrate 110.

The second electrically conductive adhesive material 150 may be the same material as, or a different material from, the first electrically conductive adhesive material 136. The second electrically conductive adhesive material 150 may include any of the materials described previously in connection with the first electrically conductive adhesive material 136.

In some embodiments, such as that shown in FIG. 3, the side surfaces 107 and 109 of the first semiconductor die 102 may be at least substantially laterally flush with the side surfaces 143 and 145 of the second semiconductor die 142. In other embodiments, one, some, or all of the side surfaces 107 and 109 and other side surfaces of the first semiconductor die 102 perpendicular thereto may extend laterally beyond corresponding side surfaces 143 and 145 of the second semiconductor die 142 and one, some, or all of the side surfaces 143 and 145 of the second semiconductor die 142 may extend laterally beyond corresponding side surfaces 107 and 109 of the first semiconductor die 102. In some embodiments, such as that shown in FIG. 3, the grounding interposer 132 may extend laterally beyond the side surfaces 107 and 109 of the first semiconductor die 102 and laterally beyond the side surfaces 143 and 145 of the second semiconductor die 142. In other embodiments, the grounding interposer 132 may extend to be laterally flush with the side surfaces 107 and 109 of the first semiconductor die 102, the side surfaces 143 and 145 of the second semiconductor die 142, or both; or may extend laterally only within the confines of the side surfaces 107 and 109 of the first semiconductor die 102, the side surfaces 143 and 145 of the semiconductor die 142, or both.

The grounding interposer 132 shown in FIG. 3 may include, for example, a semiconductor chip 152 having electrically conductive vias 154 extending between the opposite longitudinal sides thereof to provide electrical connection and grounding for the backside surfaces 106 and 146 of the first semiconductor die 102 and the second semiconductor die 142. Grounding wire bonds 122 electrically connected to the vias 154 may extend from the grounding interposer 132 to the substrate 110 to ground the backside surfaces 106 and 146 of the first semiconductor die 102 and the second semiconductor die 142. Operative wire bonds 156 may extend from the active surface 144 of the second semiconductor die 142 to the substrate 110 to enable operative connection to circuitry embedded within the active surface 144 of the second semiconductor die 142. More specifically, the operative wire bonds 156 may extend from bond pads 147 operatively connected to the integrated circuitry embedded within the active surface 144 of the second semiconductor die 142, laterally beyond the side surfaces 143 and 145 of the second semiconductor die 142, to electrically conductive elements 119 in the form of bond pads, traces, vias, or other electrically conductive structures on the upper surface 117 of the substrate 110. In some embodiments, such as that shown in FIG. 3, the operative wire bonds 156 may extend from above the grounding wire bonds 122 at the lateral periphery of the second semiconductor die 142, laterally beyond the grounding wire bonds 122, to the substrate 110, such that the operative wire bonds 156 and the grounding wire bonds 122 may not cross one another when viewed in the perspective shown in FIG. 3, perpendicular to the lateral direction in which the operative wire bonds 156 and the grounding wire bonds 122 extend. In other embodiments, the operative wire bonds 156 may extend from above the grounding wire bonds 122 at the lateral periphery of the second semiconductor die 142, longitudinally across the grounding wire bonds 122, as the grounding wire bonds 122 extend laterally and longitudinally to the substrate 110, such that the operative wire bonds 156 and the grounding wire bonds 122 may cross one another when viewed in the perspective shown in FIG. 3, perpendicular to the lateral direction in which the operative wire bonds 156 and the grounding wire bonds 122 extend. In such embodiments, the grounding wire bonds 122 and operative wire bonds 156 may be offset from one another in the direction perpendicular to their direction of lateral extension to reduce the likelihood that the grounding wire bonds 122 and operative wire bonds 156 may undesirably contact and electrically short to one another.

Figure 4:
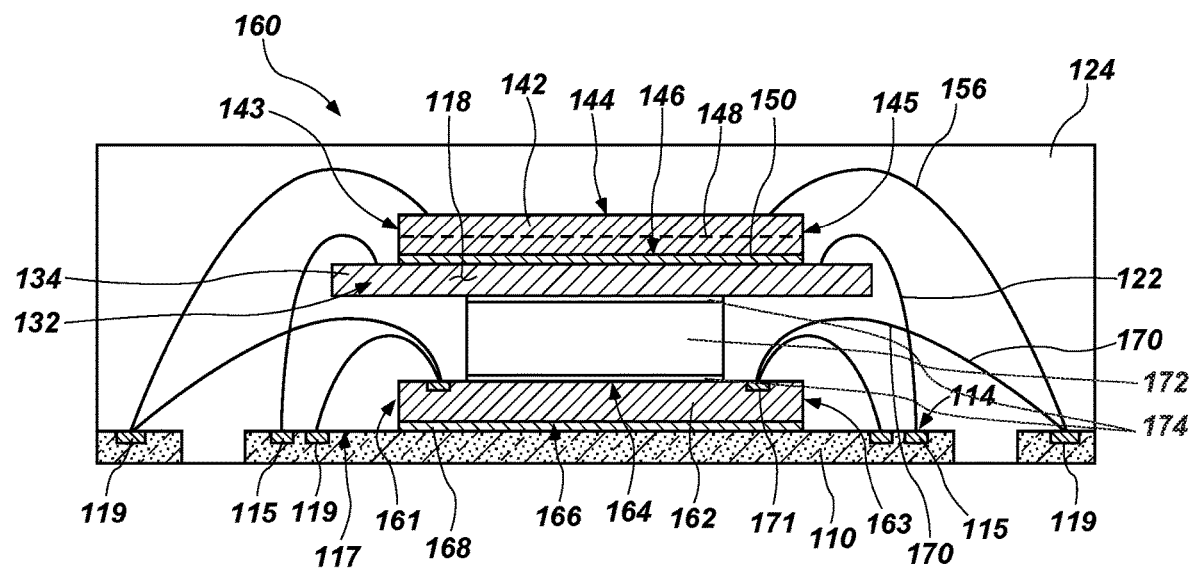
FIG. 4 is a cross-sectional side view of another embodiment of a semiconductor device including a stacked, backside-biased semiconductor die.

FIG. 4 is a cross-sectional side view of another embodiment of a semiconductor device 160 including a stacked, backside-biased second semiconductor die 142. In FIG. 4, the second, stacked second semiconductor die 142 may be configured at least substantially similarly to the second semiconductor die 142 described previously in connection with FIG. 3. The first semiconductor die 162 shown in FIG. 4 may not be in a flip-chip orientation. For example, the first semiconductor die 162 may include an active surface 164 and a backside surface 166 on a side of the first semiconductor die 162 opposite the active surface 164. The active surface 164 may include integrated circuitry embedded within semiconductor material of the first semiconductor die 162 at the active surface 164. The backside surface 166 may lack such integrated circuitry. In the embodiment shown in FIG. 4, the first semiconductor die 162 may not be backside-biased, and may lack any insulating material embedded within the material of the first semiconductor die 162 between the active surface 164 and the backside surface 166. In other embodiments, the first semiconductor die 162 may be backside-biased.

The backside surface 166 of the first semiconductor die 162 may be supported directly on an upper surface 117 of the substrate 110, and the active surface 164 of the first semiconductor die 162 may face away from the substrate 110 and toward the grounding interposer 132. The backside surface 166 may be mechanically secured to the substrate 110 by an adhesive material 168. In embodiments such as that shown in FIG. 4 in which the first semiconductor die 162 is not backside-biased, the adhesive material 168 may not be electrically conductive, and may comprise a different material from the second electrically conductive adhesive material 150 mechanically and electrically connecting the backside surface 146 of the second semiconductor die 142 to the grounding interposer 132. In other embodiments in which the first semiconductor die 162 is backside-biased, the adhesive material 168 may be electrically conductive to electrically connect the backside surface 166 of the first semiconductor die 162 to ground 114 at the substrate 110, and may comprise the same material as, or a different material from, the second electrically conductive adhesive material 150.

Operative wire bonds 170 may extend from the active surface 164 of the first semiconductor die 162 to the substrate 110 to enable operative connection to circuitry embedded within the active surface 164 of the first semiconductor die 162. More specifically, the operative wire bonds 170 may extend from bond pads 171 operatively connected to the integrated circuitry embedded within the active surface 164 of the first semiconductor die 162, laterally beyond side surfaces 161 and 163 of the first semiconductor die 162, to electrically conductive elements 119 in the form of bond pads, traces, vias, or other electrically conductive structures on the upper surface 117 of the substrate 110. In some embodiments, such as that shown in FIG. 4, some of the operative wire bonds 170 may extend from below the grounding wire bonds 122 at the lateral periphery of the first semiconductor die 162, laterally within the confines of the grounding wire bonds 122, to the substrate 110, such that some of the operative wire bonds 170 and the grounding wire bonds 122 may not cross one another when viewed in the perspective shown in FIG. 4, perpendicular to the lateral direction in which the operative wire bonds 170 and the grounding wire bonds 122 extend. Others of the operative wire bonds 170 may extend from below the grounding wire bonds 122 at the lateral periphery of the first semiconductor die 162, laterally across the grounding wire bonds 122, as the grounding wire bonds 122 extend laterally and longitudinally to the substrate 110.

A spacer 172 may be interposed between the first semiconductor die 162 and the grounding interposer 132 to provide space for the operative wire bonds 170. The spacer 172 may be secured to each of the grounding interposer 132 on a side of the grounding interposer 132 opposite the second semiconductor die 142 and to the active surface 164 of the first semiconductor die 162 by an adhesive material 174, which may not be electrically conductive. The spacer 172 may comprise a dielectric material, such as, for example, a nonconductive polymer material.

Figure 5:
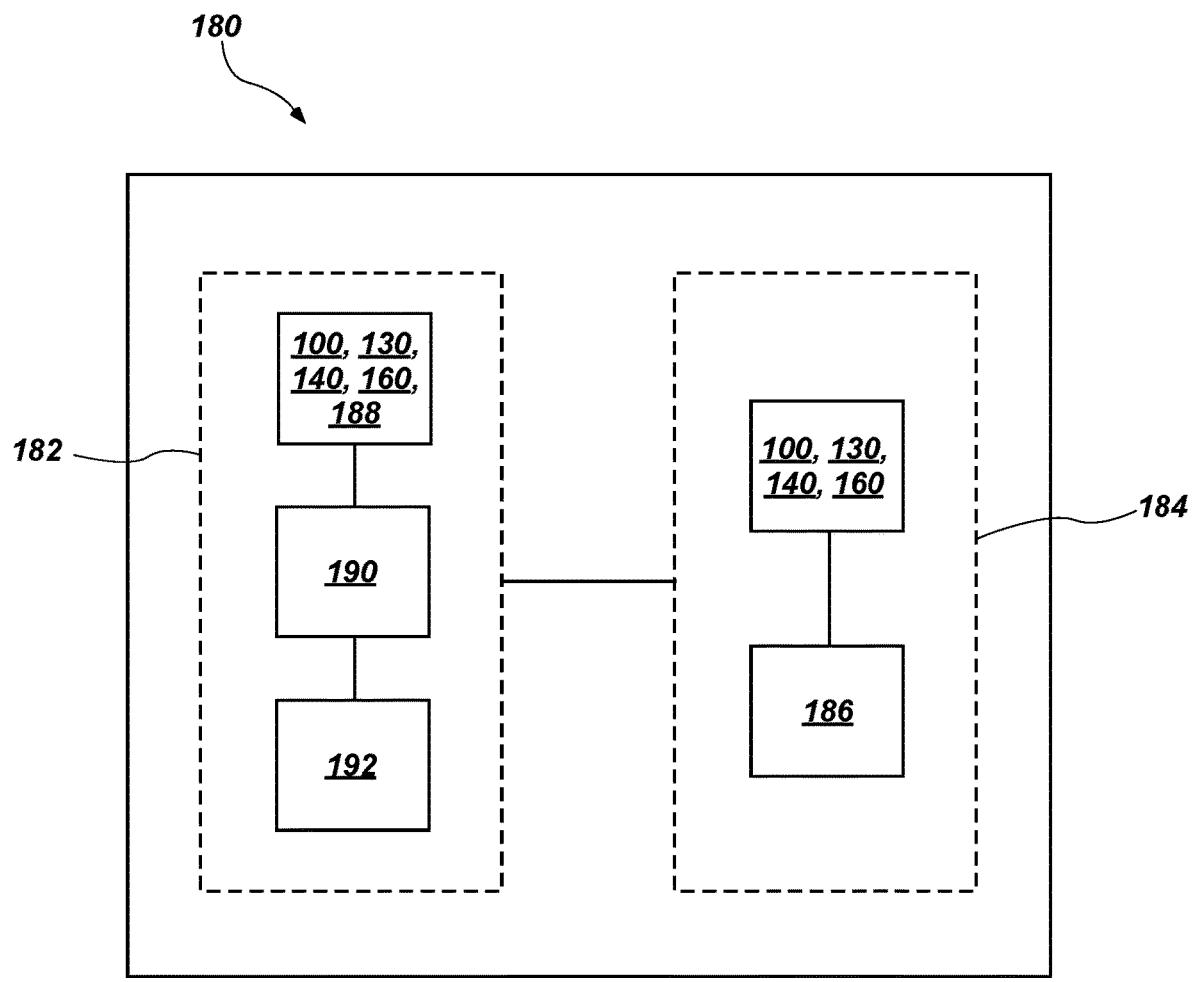
FIG. 5 is a schematic of a system including a semiconductor device in accordance with this disclosure.

FIG. 5 is a schematic of a system 180 including one or more semiconductor devices 100, 130, 140, 160 in accordance with this disclosure. For example, the system 180 may include a control unit 182 and a probe unit 184. The probe unit 184 may be include a sensor device 186 configured to generate an electrical signal representative of, and in response to, a detected physical phenomenon. The probe unit 184 may be a portable device, such as, for example, a handheld device. In some embodiments, the probe unit 184 may include a semiconductor device 100, 130, 140, 160 in accordance with this disclosure located within the probe unit 184, the semiconductor device 100, 130, 140, 160 configured to at least partially process the electrical signal locally within the probe unit 184. The probe unit 184 may be operatively connected to the control unit 182 (e.g., over a wired or wireless connection) and may send the raw, partially processed, or fully processed electrical signal to the control unit 182. In some embodiments, the control unit 182 may include another semiconductor device 100, 130, 140, 160 in accordance with this disclosure or a microprocessor 188, which may process or further process the electrical signal. The control unit 182 may include a nontransitory memory device 190 configured to store the results of the fully processed electrical signal. The control unit 182 may optionally include an output device 192 (e.g., an electronic display, an audio speaker, a printer, etc.) configured to output the results of the fully processed electrical signal.

Semiconductor devices 100, 130, 140, 160 in accordance with this disclosure may be particularly useful when implemented in medical devices, such as, for example, ultrasound devices. The thin profile, light weight, low-power, and electronically stable constructions enabled by semiconductor devices 100, 130, 140, 160 in accordance with this disclosure may render such systems 180 smaller, easier to transport, and may produce higher fidelity representations of sensed phenomena because the semiconductor devices 100, 130, 140, 160 in accordance with this disclosure may reduce interactions with the sensing equipment.

Accordingly, semiconductor devices may include a substrate and a backside-biased semiconductor die. A backside surface of the backside-biased semiconductor die may be spaced from the substrate and be electrically connected to ground by one or more wire bonds extending to the substrate.

Methods of making semiconductor devices may involve supporting a backside-biased semiconductor die with, a backside surface thereof spaced from the substrate. The backside surface may be electrically connected to ground by one or more wire bonds extending to the substrate.

Systems may include a sensor device, a nontransitory memory device, and at least one semiconductor device operatively connected thereto. The at least one semiconductor device may include a substrate and a backside-biased semiconductor die. A backside surface of the backside-biased semiconductor die may be electrically connected to ground by one or more wire bonds extending to the substrate.

While certain illustrative embodiments have been described in connection with the figures, those of ordinary skill in the art will recognize and appreciate that the scope of this disclosure is not limited to those embodiments explicitly shown and described in this disclosure. Rather, many additions, deletions, and modifications to the embodiments described in this disclosure may be made to produce embodiments within the scope of this disclosure, such as those specifically claimed, including legal equivalents. In addition, features from one disclosed embodiment may be combined with features of another disclosed embodiment while still being within the scope of this disclosure, as contemplated by the inventors.

What is claimed is:

1. A semiconductor device, comprising:
 a substrate;
 a backside-biased semiconductor die comprising an active surface having integrated circuitry, a backside surface located on a side of the backside-biased semiconductor die opposite the active surface, an electrically insulating material interposed between the active surface and the backside surface, and semiconductor material located on opposite sides of the electrically insulating material and extending from the electrically insulating material to the active surface and the backside surface on the opposite sides of the electrically insulating material, wherein the electrically insulating material forms an electrical barrier insulating the semiconductor material proximate to the active surface from the semiconductor material proximate to the backside surface; and
 a single, contiguous mass of metal or metal alloy located directly on the backside surface, the backside surface of the backside-biased semiconductor die being spaced from the substrate and electrically connected to ground by one or more wire bonds extending from the mass of metal or metal alloy to the substrate.

2. The semiconductor device of claim 1, wherein the metal or metal alloy comprises copper, gold, aluminum, or alloys including such metals.

3. A method of making a semiconductor device, comprising:
 supporting a backside-biased semiconductor die above a substrate, the backside-biased semiconductor die comprising an active surface having integrated circuitry, a backside surface located on a side of the backside-biased semiconductor die opposite the active surface, an electrically insulating material interposed between the active surface and the backside surface, and semiconductor material located on opposite sides of the electrically insulating material and extending from the electrically insulating material to the active surface and the backside surface on the opposite sides of the electrically insulating material, wherein the electrically insulating material forms an electrical barrier insulating the semiconductor material proximate to the active surface from the semiconductor material proximate to the backside surface;
 placing a single, contiguous mass of metal or metal alloy directly on the backside surface, the backside surface of the backside-biased semiconductor die being spaced from the substrate; and
 electrically connecting the backside surface to ground by wire bonds extending from the mass of metal or metal alloy to the substrate.

4. The method of claim 3, wherein placing the mass of metal or metal alloy directly on the backside surface comprises placing copper, gold, aluminum, or alloys including such metals directly on the backside surface utilizing a plating, chemical vapor deposition, or sputtering process.

5. A system, comprising:
 a sensor device;
 a nontransitory memory device; and
 at least one semiconductor device operatively connected to the sensor device and the nontransitory memory device, the at least one semiconductor device comprising:
  a substrate;
  a backside-biased semiconductor die comprising an active surface having integrated circuitry, a backside surface located on a side of the backside-biased semiconductor die opposite the active surface, an electrically insulating material interposed between the active surface and the backside surface, the backside surface of the backside-biased semiconductor die being spaced from the substrate, and semiconductor material located on opposite sides of the electrically insulating material and extending from the electrically insulating material to the active surface and the backside surface on the opposite sides of the electrically insulating material, wherein the electrically insulating material forms an electrical barrier insulating the semiconductor material proximate to the active surface from the semiconductor material proximate to the backside surface; and
  a single, contiguous mass of metal or metal alloy located directly on the backside surface, the backside surface being electrically connected to ground by one or more wire bonds extending from the mass of metal or metal alloy to the substrate.

* * * * *